(12) United States Patent
Leu

(10) Patent No.: US 10,312,164 B2
(45) Date of Patent: Jun. 4, 2019

(54) METHOD AND SYSTEM FOR INTELLIGENT WEAK PATTERN DIAGNOSIS, AND NON-TRANSITORY COMPUTER-READABLE STORAGE MEDIUM

(71) Applicant: ELITETECH TECHNOLOGY CO., LTD., Hsinchu County (TW)

(72) Inventor: Iyun Leu, Hsinchu (TW)

(73) Assignee: ELITE SEMICONDUCTOR, INC., Hsinchu County (TW)

( * ) Notice: Subject to any disclaimer, the term of this patent is extended or adjusted under 35 U.S.C. 154(b) by 601 days.

(21) Appl. No.: 14/281,909

(22) Filed: May 20, 2014

(65) Prior Publication Data

US 2014/0343884 A1    Nov. 20, 2014

Related U.S. Application Data

(60) Provisional application No. 61/825,217, filed on May 20, 2013.

(51) Int. Cl.
*H01L 21/66* (2006.01)
*G06F 11/00* (2006.01)
*G01R 31/3185* (2006.01)

(52) U.S. Cl.
CPC ...... *H01L 22/20* (2013.01); *G01R 31/318544* (2013.01); *H01L 22/12* (2013.01)

(58) Field of Classification Search
CPC ......... H01L 22/12; H01L 22/20; G06Q 10/06; G06Q 10/06395

USPC .......... 702/82, 117, 155, 167, 182, 183; 382/141; 700/105; 714/726; 716/52

See application file for complete search history.

(56) References Cited

U.S. PATENT DOCUMENTS

| | | | |
|---|---|---|---|
| 8,050,488 B2 | 11/2011 | Kim et al. | |
| 8,316,265 B2* | 11/2012 | Guo | G01R 31/318544 714/726 |
| 8,607,169 B2* | 12/2013 | Leu | G05B 19/41875 716/100 |
| 9,129,237 B2* | 9/2015 | Leu | G06Q 10/06395 |
| 2012/0259574 A1* | 10/2012 | Hu | H01L 22/20 702/117 |

FOREIGN PATENT DOCUMENTS

| | | |
|---|---|---|
| CN | 102881609 A | 1/2013 |
| TW | 201237443 A1 | 9/2012 |

* cited by examiner

*Primary Examiner* — John H Le
(74) *Attorney, Agent, or Firm* — Muncy, Geissler, Olds & Lowe, P.C.

(57) ABSTRACT

Disclosure herein is related to a method and a system for intelligent weak pattern diagnosis for semiconductor product, and a related non-transitory computer-readable storage medium. In the method, a weak pattern layout is firstly retrieved from a defect pattern library and a frequent failure defect pattern library; defect data is retrieved from fab defect inspection tool; a design layout is then received and weak defect pattern screen is performed to extract known and unknown weak defect patterns. In addition to updating the weak pattern library, the weak pattern contour can be made upon SEM image data, and then the true systematic weak pattern can be justified.

19 Claims, 10 Drawing Sheets

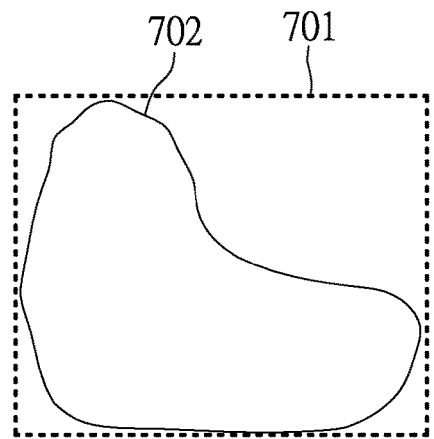
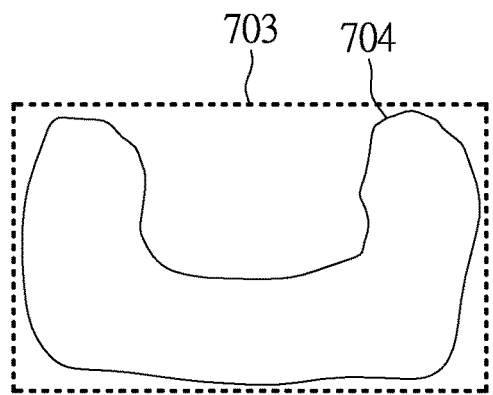
FIG.7A  FIG.7B
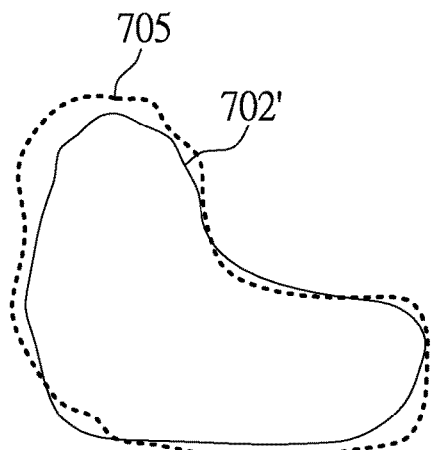
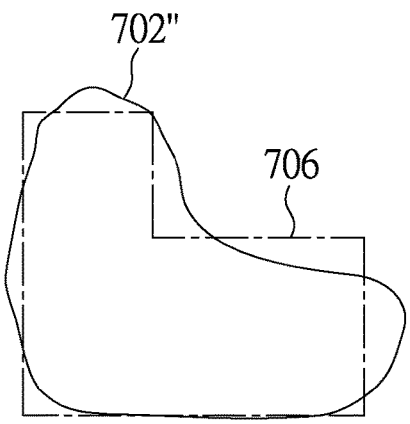
FIG.7C  FIG.7D

METHOD AND SYSTEM FOR INTELLIGENT WEAK PATTERN DIAGNOSIS, AND NON-TRANSITORY COMPUTER-READABLE STORAGE MEDIUM

BACKGROUND OF THE INVENTION

1. Field of the Invention

The present invention is generally related to a method, a system for intelligent weak pattern diagnosis, and a non-transitory computer-readable storage medium, in particular, to the method and system using software and hardware for screening out the weak patterns in the beginning of fabrication process.

2. Description of Related Art

The conventional and essential IC manufacturing steps such as thin-film deposition, mask exposure, and photolithography etching may suffer yield declination since the process may not easily avoid the defects caused by random particles and systematic defects. Low yield rate may result in high cost chip fabrication. Therefore, a fast diagnosis tool for defects in the semiconductor fabrication process is requisite.

Furthermore, the conventional photolithography etching technology may confront the optical limitation while the scale of semiconductor process is getting smaller. The weak defect patterns are just the consequence of complex design layout, optical proximity correction, and the complex fabrication process. The weak defect patterns may cause open circuit or short circuit failure of the design layout. And the failure results in low yield rate. However, it is possible that the known defect patterns or the unknown defect patterns can be recognized in the beginning of pre-manufacturing stage. For example, a weak pattern screen is performed onto the defect inspection data.

Operators of Fab generally utilize an electron microscope, e.g. a scanning electron microscope (SEM) to monitor and preview. Further, an e-Beam scan tool is used to detect and verify the killer detect patterns on the chip. However, the Fab still suffers low yield rate without any benefit of high production or longer product cycle if no fast or innovative technology is incorporated to recognizing the killer weak defect patterns in the beginning of the fabrication process.

It is noted that the conventional defect inspection and analysis tool fails to effectively find out the weak defects in the beginning of the fabrication process.

SUMMARY OF THE INVENTION

The present invention generally relates to a method, a system of intelligent weak pattern diagnosis, and further to a computer-readable storage medium. In particular, the method and the system are embodied in software and hardware-implemented framework which is operated especially in a semiconductor fabrication for screening and matching the weak patterns in the beginning.

In one of the embodiments of the present invention, the method of intelligent weak pattern diagnosis may be applied to a computer-implemented intelligent weak pattern diagnosis system. In the method, in the computer system, a weak pattern layout is introduced from a defect pattern library and a frequent failure defect pattern library; through a defect inspection tool in a fab, defect inspection data may be acquired; and a design layout data is introduced for conducting screen and filter over the weak patterns. In the computer system, the design layout data is compared with the weak patterns recorded in the defect pattern library and the frequent failure defect pattern library. A known weak pattern group may be acquired through the categorization.

Next, the process goes on screening or filtering unknown weak patterns. In the computer system, the design layout data is retrieved to be compared with the weak patterns in the defect pattern library and the frequent failure defect pattern library. The weak patterns which do not belong to, and are not similar with the patterns recorded in the libraries are categorized to an unknown weak pattern group. Distribution of the known weak pattern group and the unknown weak pattern group can therefore be obtained.

After that, an image of an object under test is acquired within the unknown weak pattern group having the similar but not identical weak patterns. The coordinates and metrology data of weak patterns of the object under test may be retrieved. Through an image processing, the contours of the weak patterns, and dimension, range, and number of the weak patterns can be measured so as to judge systematic weak patterns.

The step for performing screen and filter over the weak patterns is such as contour matching/tracing. The contour matching incorporates basic matching elements and basic polygon pattern matching elements to be compared with the patterns of object under test.

In the step of contour matching, an overlapped area percentage of the matching elements on the object under test is as a basis for judgment. The contour matching may be assisted by incorporating a centerline matching using the centerlines of the basic matching elements or the polygon pattern matching elements. Within an acceptable tolerance, the similar weak patterns may be obtained. Such the weak patterns may be verified by judging the size as comparing with the matching elements, the distances, directions, and connections between the patterns.

In one further embodiment, a computer-implemented intelligent weak pattern diagnosis system is disclosed. A processor of the computer system executes the method of intelligent weak pattern diagnosis described above.

A non-transitory computer-readable storage medium is also disclosed. In which, an instruction set for performing the method of intelligent weak pattern diagnosis is stored in the storage medium. The instruction set is executed in the computer system. The instruction set includes instruction for introducing weak pattern layout from a defect pattern library and a frequent failure defect pattern library; instruction for introducing a weak pattern layout; instruction for retrieving defect inspection data from a Fab using a defect inspection tool; instruction for introducing a design layout data which at least includes various systematic defect and weak patterns; instruction for performing weak pattern screen and filter which is used to compare the design layout data and the weak patterns recorded in the defect pattern library and the frequent failure defect pattern library, and being categorized into a known weak pattern group; instruction for performing unknown weak pattern screen and filter which is used to find out the weak patterns from the design layout that do not belong to and not similar with the patterns recorded in the defect pattern library and the frequent failure defect pattern library, and being categorized into a unknown weak pattern group; instruction for obtaining distribution of the known weak pattern group and the unknown weak pattern group; instruction for receiving an image of object under test including coordinates and metrology data of the weak patterns; instruction for executing image processing for acquiring contour, dimension, range and number of the weak patterns, so as to judge the systematic weak patterns; and instruction for updating the weak pattern library.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein:

FIG. 7A to FIG. 7D schematically show the method for finding out the weak patterns in one embodiment of the present invention;

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

The design house generally provides a design layout of its IC design to the foundry fab. The Fab utilizes hundreds of equipment to fabricate a lot of duplicated dice according to the design layout on a wafer. During the fabrication, some defects such as random particle defects, process defects, or systematic defects may be inevitably generated on the wafer. Therefore, some inspection tools are utilized to scan the wafer and obtain defects. Then, defect sampling method is used for finding out the random defects and systematic defects. The further improvement for modifying the design based on the defect information therefore increases the yield.

The weak defects may be eliminated effectively when the positions of the defect patterns can be recognized in the beginning of fabrication. The yield may also be increased. Disclosure herein is related to a method for intelligent weak pattern diagnosis, a system thereof, and a computer-readable storage medium. The system is based on software and hardware framework. Based on the defect images of design layout, the method in accordance with the present invention is able to compare with the basic pattern and contour for screening out the weak patterns efficiently. The method is preferably applied to the semiconductor fab such as wafer fab, IC, or process design house.

Figure 1:
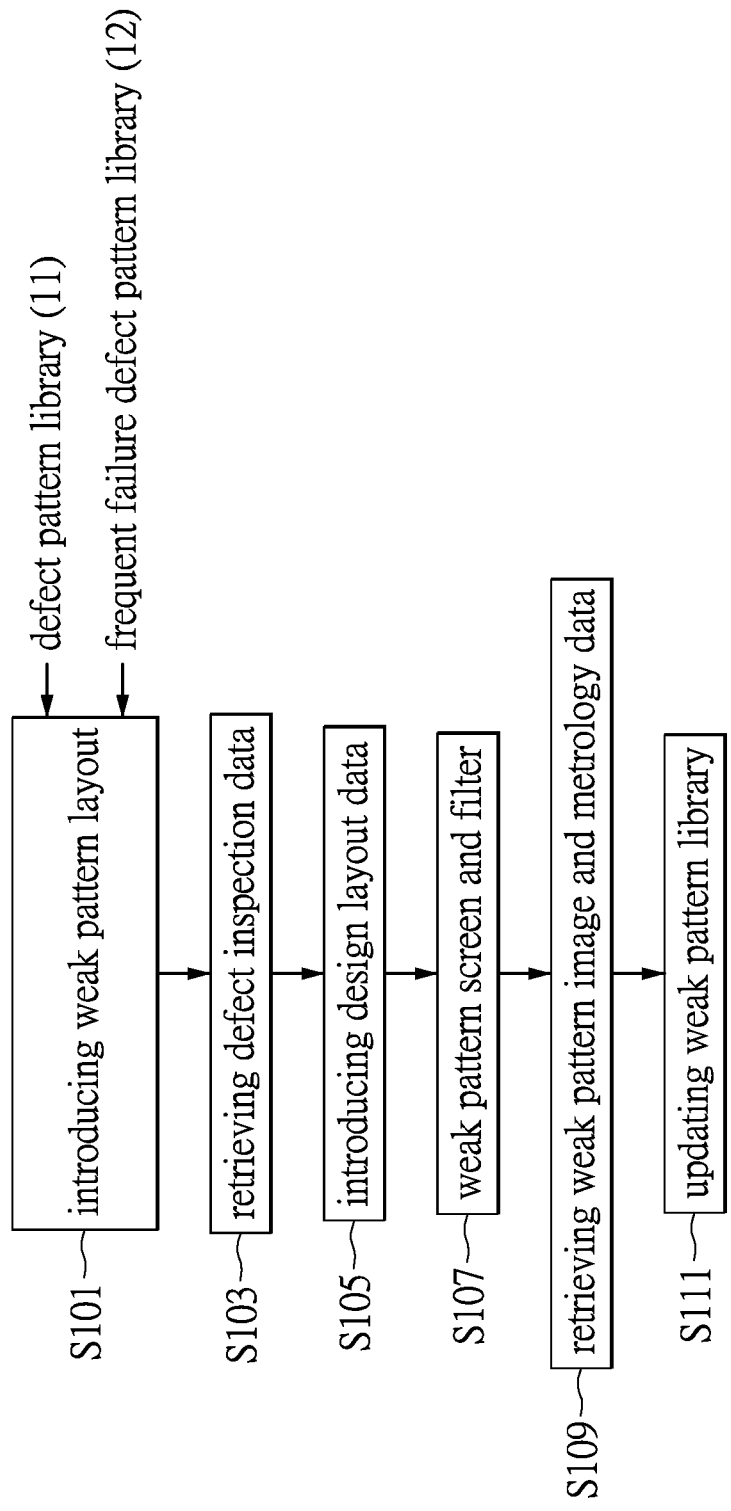
FIG. 1 shows a flow chart illustrating method for intelligent weak pattern diagnosis in accordance with the present invention.
Figure 2:
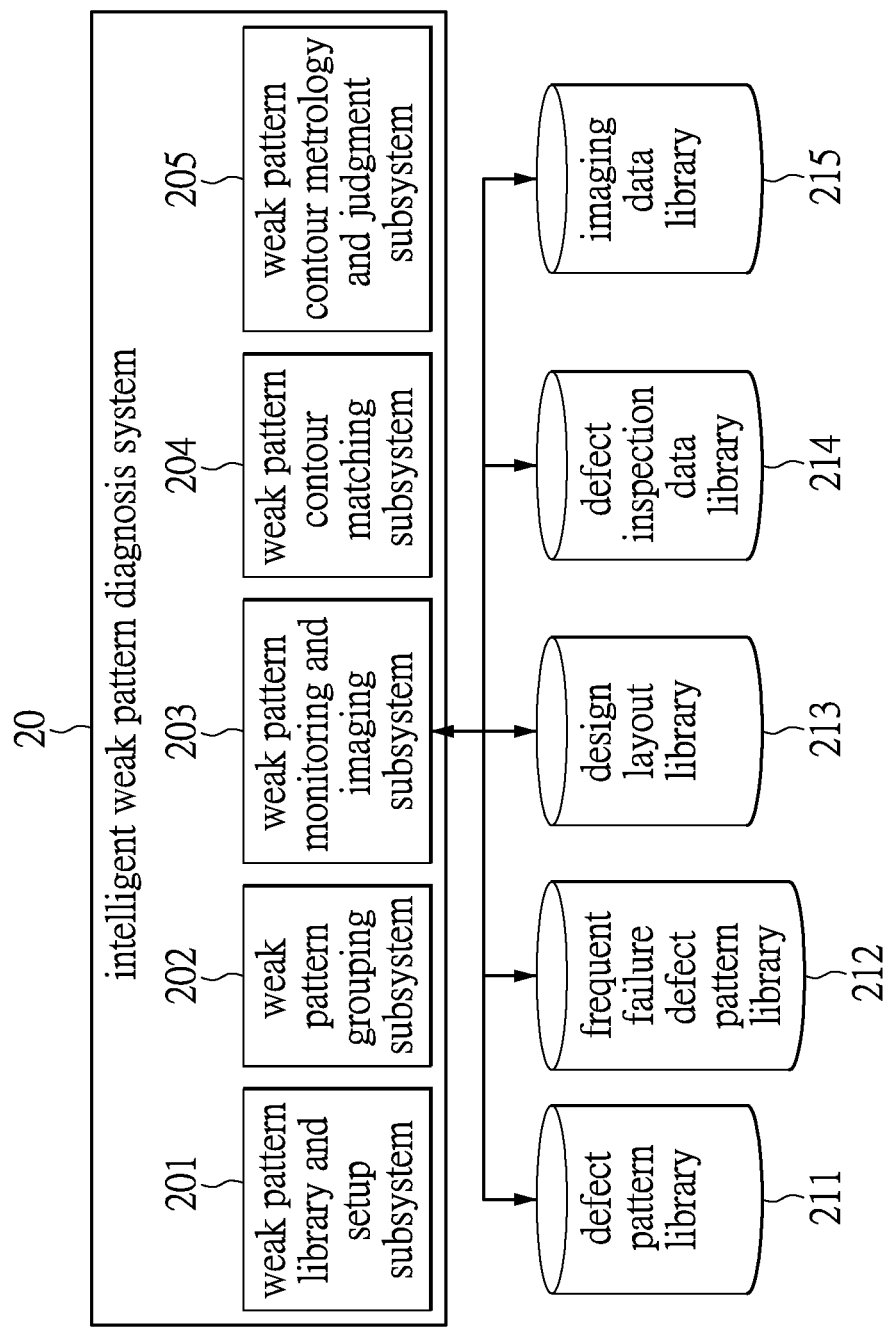
FIG. 2 shows a schematic diagram depicting a hardware framework of the system of intelligent weak pattern diagnosis according to one of the embodiments of the present invention.

Reference is made to FIG. 1 showing a flow chart illustrating a method of intelligent weak pattern diagnosis in one embodiment. A computer system embodies the software and hardware-implemented intelligent weak pattern diagnosis system. The system includes several types of databases. FIG. 2 schematically shows the embodiments, and the software module can be referred to the embodiments revealed in FIG. 3.

The semiconductor fabrication process may not easily prevent the systematic defects from happening. Similar to the failure random particles, the process defects or systematic defects may result in fatal error.

In the beginning of present computer-implemented method for intelligent weak pattern diagnosis, such as step S101, the system retrieves weak pattern layout from a defect pattern library 11 and a frequent failure defect pattern library 12. The defect pattern library 11 and frequent failure defect pattern library 12 are beforehand stored in Fab. It is noted that the design layout (OASIS, GDSII, etc.) is from the design house.

It is noted that the "unknown weak pattern" means the pattern is not matched with the libraries such as the mentioned defect pattern library or frequent failure defect pattern library. It is worth noting that the "defect pattern library" may be referred to the same inventor/applicant's own U.S. Pat. No. 8,312,401, issued on Nov. 13, 2012, and the "frequent failure defect pattern library" may be referred to the same inventor/applicant's previously-filed U.S. Pat. No. 8,607,169, issued on Dec. 10, 2013.

In the system, in step S103, defect inspection data can be retrieved by a defect inspection tool in a fab, such as wafer fab. That means the defects are detected by a defect scan and inspection tool at the Fab. Then the defect scan and inspection tool produces a plurality of defect data corresponding to the defects. Further in step S105, the system introduces design layout data which may be in various formats such as OASIS or GDSII. The design layout data includes various systematic defects and weak patterns. According to one of the embodiments, a mechanism of weak pattern screen and filter is incorporated to determining positions of weak patterns on the design layout. The weak patterns are then applied to the semiconductor product in the fabrication process, and referred to improve yield.

Next in step S107, the process of weak pattern screen and filter includes performing unknown weak pattern screen and filter. The following pattern and contour matching method is introduced to the screening and filtering. While the system retrieves the design layout data, the weak patterns recorded in the defect pattern library and the frequent failure defect pattern library are used to conduct the matching with the design layout data. Next, a scanning electron microscope (SEM) is utilized to process the inspection, so as to find out the known weak pattern group by categorization, and the unknown weak pattern group with patterns which do not belong to, and are not similar with the weak patterns in the libraries. Further, distribution of the known and unknown weak pattern group is as well to be obtained. In one further embodiment of the present invention, an optical microscope may also be incorporated to inspecting the weak patterns as introducing an optical defect image database to performing weak pattern matching. Through image recognition, the weak patterns are categorized into known and unknown weak pattern groups.

For example, the operator in Fab may manipulate the scanning electron microscope (SEM) to monitor and preview an object under test, such as semiconductor product. The operator may use an e-Beam scan tool to detect and verify the defect patterns on the object under test.

While the scanning electron microscope or optical microscope is utilized to scan the image of object under test, e.g. wafer, the coordinates and metrology data of weak patterns can be recognized. Such as step S109, an initial image processing is performed, for example overlapping the contours in the database onto the image of object under test. The contour, dimension, range and number regarding the weak patterns can be determined. The information of the weak patterns may be provided for the Fab to judge the systematic defects for future improvement of yield.

In step S111, the information of weak patterns may also be used to update the defect pattern library. Further in this step, a process of weak pattern verification may be executed and then output the verified weak patterns to weak pattern library. If any new weak pattern is found, the defect pattern library can be updated.

Through the method of intelligent weak pattern diagnosis according to one of the embodiments, the operators in Fab may efficiently acknowledge the systematic defects, especially the weak patterns regarded in an in-line weak pattern inspection, in the earlier stage of the process. The inspection of weak patterns is used for defects screening.

Reference is made to FIG. 2 depicting a hardware framework for implementing the method of intelligent weak pattern diagnosis in one embodiment of the present invention.

In the diagram, the several major subsystems of the intelligent weak pattern diagnosis system 20 are disclosed. The each subsystem conducts specific function in the system 20. For example, a weak pattern library and setup subsystem 201 renders a weak pattern library for providing the various polygon weak patterns as reference for comparison.

A weak pattern grouping subsystem 202 is included in the system 20, by graphic processing (mainly by pattern match), for screening out the known weak pattern group and unknown weak pattern group from a design layout.

A weak pattern monitoring and imaging subsystem 203 is used to scan and retrieve weak patterns on a semiconductor product, e.g. wafer, through a scanning electron microscope or an optical microscope. The weak pattern monitor and imaging subsystem 203 further monitor and store the images into storage medium.

A weak pattern contour matching subsystem 204 is used to acquire information of the weak patterns by comparing with the various polygon weak patterns in the weak pattern library and the image weak pattern data from defect scan and inspection.

A weak pattern contour metrology and judgment subsystem 205, based on the contour and metrology data in weak pattern library, is used to recognize the types of the weak patterns. The recognition of weak patterns allows the semiconductor fabrication process to avoid the systematic defects efficiently. The information of weak patterns may be adapted to optical proximity correction (OPC) and to be reference to optimize the design layout.

The intelligent weak pattern diagnosis system 20 may be embodied by hardware and software based framework. The hardware means is made by one or more computer systems having processor, memory, and signal transmission circuits. The data retrieved by the system 20 may be from various databases, such as the pattern libraries in accordance with functions. The libraries are, but not limited to, such as the shown defect pattern library 211, frequent failure defect pattern library 212, design layout library 213, defect inspection data library 214, and imaging data library 215.

In particular, the design layout library 213 is created by collecting the weak and defect patterns acquired from the design layout from the IC design house. The defect inspection data library 214 includes the data from the wafer inspection by inspection tool in Fab. The inspection data is stored as digital images. The imaging data library 215 includes the images while a scanning electron microscope directly captures from the wafer. The imaging data library 215 may include the optical defect image data made by the optical microscope.

Figure 3:
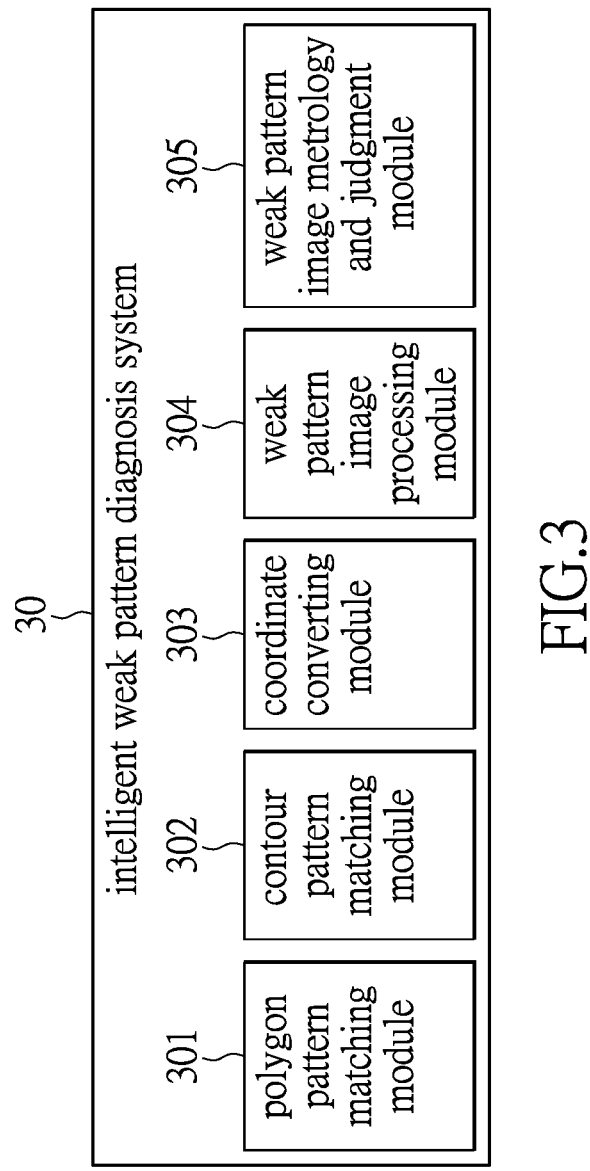
FIG. 3 shows one further schematic diagram depicting a software framework of the intelligent weak pattern diagnosis system according to the embodiment of the present invention.

The related software-based framework can be referred to FIG. 3 depicting the intelligent weak pattern diagnosis system in one embodiment.

The intelligent weak pattern diagnosis system 30 is made by various software modules in accordance with the processes made by the different modules. The functions are, but not limited to, performed by the instruction set installed in the system 30.

The system 30 includes a software-implemented polygon pattern matching module 301. Through this software module 301, the scanned weak pattern image is compared with the pattern data in the weak pattern library. The polygon pattern matching module 301 is able to categorize the weak patterns which may be well matched with or similar with the data in the library.

The system 30 includes one other software-implemented contour pattern matching module 302. This software module 302 employs the contour images in the weak pattern library as a comparison reference to find out the matched or similar real weak patterns.

Further, through a coordinate converting module 303 of the system 30, the images of weak patterns of design layout can be converted to the coordinates of the object under test, e.g. wafer. The various weak patterns for the software module 303 may be acquired by scanning electron microscope.

A weak pattern image processing module 304 is also included in the system 30. The weak pattern image processing module 304 is mainly used to digitalize the scanned weak or defect patterns. Through the above mentioned schemes such as polygon pattern matching, contour image matching, and coordinates conversion, the data of various weak or defect patterns can be obtained for the further categorization, grouping, recognition, and measurement.

Further, a software-implemented weak pattern image metrology and judgment module 305 is included. This software module 305 is used to recognize the weak patterns on the object under test, e.g. wafer, including identifying the weak pattern's metrology data such as dimension and aspect ratio.

While the known and unknown weak patterns are recognized, coordinates of the patterns can be defined over the design layout. The coordinate system of design layout with an origin $(x_0, y_0)$ may be converted to the coordinate system with origin $(x_1, x_1)$ of the tool such as scanning electron microscope to monitor the product, namely the real semiconductor product. That means, the defect or weak patterns found on the coordinate system of design layout can be converted to the coordinate system of the inspection tool that scans the real product.

The hardware and software schemes for the system embodying the method of intelligent weak pattern diagnosis in accordance with the present invention may be applied to different stages in the fabrication process. For example, the method is applicable to the semiconductor wafer manufacturing process in Fab, the process in assembly house, the mask house, and furthermore to the manufacturing process for printed circuit board, carrier board, flexible board, flat display panel, wafer bump, light-emitting diode (LED), or solar cell.

Figure 4:
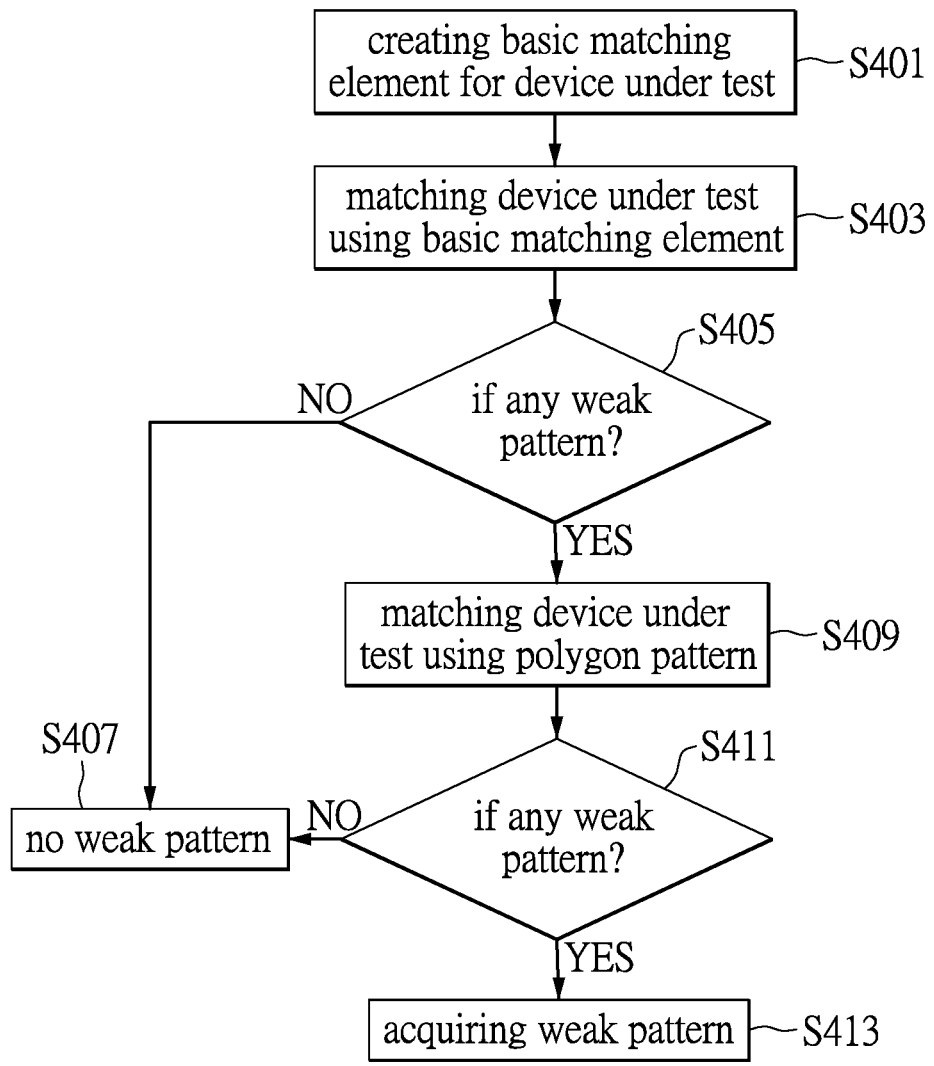
FIG. 4 shows a flow chart illustrating a process of pattern matching in the method of intelligent weak pattern diagnosis in accordance with the present invention.

Reference is made to FIG. 4 depicting the steps of pattern matching in the method of intelligent weak pattern diagnosis in one embodiment.

While the SEM is utilized to scan the weak patterns over the design layout, at least one basic matching element may be firstly created according to one of embodiments. The basic matching element is used to depict the weak pattern similar with the matching element, for example a polygon matching element. The comparison based on the basic geometric graphics is performed to determine the weak pattern(s).

In the method, such as a beginning step S401, at least one basic matching element over the object under test is created. For example, a plurality of fundamental bonding boxes can be formed over the design layout. The interconnections among the basic matching elements may be overlapped cover the whole design layout, and allow the subsequent comparison operation.

After the at least one basic matching element is created, such as step S403, the basic matching elements are applied to the object under test, e.g. wafer. The basic matching element such as a square is required to be with its dimension, length and width. The relationship between the dimensions, distances, and directions for the basic matching elements are employed to depict the various weak patterns in the weak pattern library. The distances or/and directions among the basic matching elements are the reference basis to perform comparison with the patterns over the object under test. The matching operation is performed within an acceptable tolerance for acquiring the suspicious weak patterns over the object under test. It is noted that the weak pattern may be substantially described in combination of multiple basic matching elements.

The matching process may be implemented by means of software. In step S405, the result of comparison is introduced to judging if any weak pattern acquired. If the patterns of object under test may not be described by combining the basic matching elements, it means there is no any weak pattern found in the current stage, such as step S407.

Otherwise, if at least one weak pattern over the object under test is found, in the next step S409, the polygon matching elements are then employed to match the object under test.

Next, centerline of the polygon pattern is introduced to performing the matching process. Characteristics of design layout may be introduced to the system for determining one or more polygonal geometric graphics. Then the basic polygon pattern matching elements are employed to perform matching process. The weak patterns of the object under test can be found while the basic polygon pattern matching elements are involved in the clockwise or counterclockwise matching process. In the matching process, the system incorporates matching schemes such as centerline trace matching, and centerline width matching. The same or similar weak patterns can be acquired in view of information of centerline and width within an acceptable tolerance.

Next, a polygon pattern contour matching process can be used for compare the one or more basic polygon pattern matching elements with the patterns over the object under test. In the contour matching process, the contours of patterns, or the contours in view of the polygon patterns are incorporated. In particular, an overlapped area percentage of the every pattern of the object under test and the one basic matching element or basic polygon pattern matching element is as basis of judgment. While in view of centerline of the basic matching element or the basic polygon pattern matching element, a similar weak pattern within an acceptable tolerance can be judged.

After the comparison performed through the basic polygon pattern matching elements, such as step S411, it is determined that if any weak pattern found based on the comparison. If there is no weak pattern found in the comparison, it shows there is no killer defect, such as step S407.

Otherwise, any weak pattern found means the weak patterns are existed over the design layout, such as step S413. The analysis reveals the potential systematic weak/defect patterns for the reference to modify the original design or to improve the fabrication process.

While the mentioned matching process adopts the basic matching element or/and basic polygon pattern matching element, the system may still modify the matching elements as requires. Next, the same or similar patterns regarding the whole system can be obtained according to analysis of relationship among the matching elements. For example, the analysis may be in consideration of the patterns' dimension, directions, and the interconnections. It is noted that the comparison may be done within an acceptable tolerance.

FIG. 5A through FIG. 5F schematically show the matching elements adopted by the system in accordance with present invention. The shown basic matching element is such as the basic geometric patterns which are used to describe the near-polygonal weak patterns. An overlapped area percentage, which is used to judge the matching, of the basic matching element forming a window area overlapping the polygonal weak pattern can be measured.

Figure 5A:
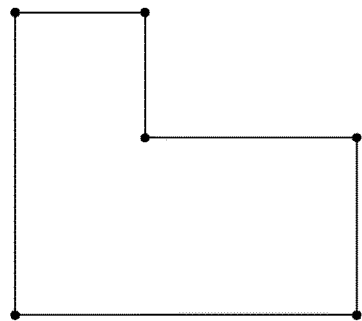
FIG. 5A to FIG. 5F schematically show the basic matching elements and the basic polygon pattern matching elements according to the embodiment of the invention.

In FIG. 5A, a schematic diagram depicts a basic polygon pattern matching element. The diagram shows a design layout window area including the bonding box(es). The polygon pattern matching element is such as a geometric graphics having one or more turning points. The matching process is performed by clockwise or counterclockwise rotating the polygon pattern matching element. In the process, the dimension of the matching element may be instantly adjusted so as to find out the same or similar weak pattern(s).

Figure 5B:
Figure 5C:
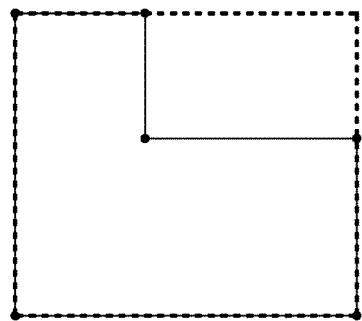

The basic matching element shown in FIG. 5B is such as a square matching element. The basic matching element defining a minimum area is employed to obtain the killer defects.

While in combination of the basic matching element and the basic polygon pattern matching element, the types of weak patterns can be identified.

Figure 5D:
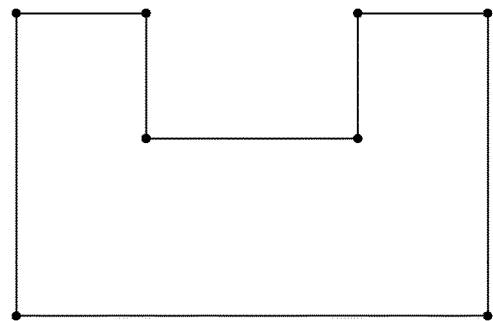
Figure 5E:
Figure 5F:
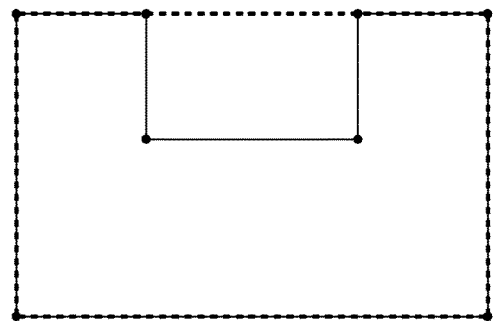

One further basic polygon pattern matching element is schematically shown in FIG. 5D. FIG. 5E schematically shows another exemplary basic matching element. FIG. 5F shows a schematic diagram describing the cooperation of the basic matching element and the basic polygon pattern matching element.

The basic matching elements or/and the basic polygon pattern matching elements are exemplarily applied to the design layout when they are created in the system. In the matching process, for example, the basic polygon pattern matching element may be rotated by software means and assisted with the centerline.

The centerline may be created along the shape of the basic polygon pattern matching element. One or more widths (w1, w2, w3, w4) along the centerline to the edges of the element are then defined. The centerline may be with the basic matching element applied to the design layout. The characteristics such as the well-defined widths of the centerline are as the reference to perform the matching process. Other characteristics such as the trajectory, starting point, end point, turning point(s), and width(s) of the centerline are also introduced to making the judgment of the weak patterns. The weak patterns can be obtained while the comparison using the characteristics of centerline assisted with clockwise or counterclockwise rotation of the matching elements is performed within an acceptable tolerance.

Figure 6A:
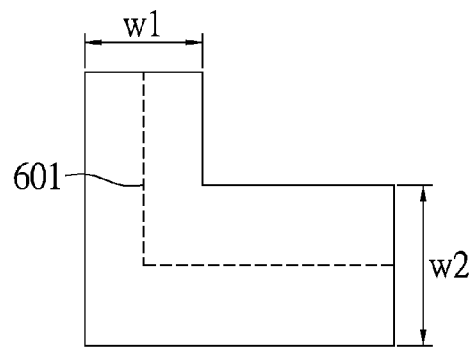
FIG. 6A to FIG. 6D schematically show the scheme using centerlines of the basic matching elements and the basic polygon pattern matching elements in accordance with the present invention.

The centerline 601 within the L-shaped matching element shown in FIG. 6A has two different directions which are depicted by continuous numerous pixels. The centerline 601 is configured to have different widths over the two orientations of the matching elements. That means the first width w1 and second width w2 characteristically describe the centerline 601. The characteristics of the centerline 601 are used to depict the main orientations of the weak pattern. In the matching process, within an acceptable tolerance setup value for example around 20% or within a certain range around 10% to 20%, the similarity between the matching element and the real pattern can be checked as the characteristics of the centerline 601 matched with the centerline of the real pattern. There is no matched weak pattern found in the matching process if the difference exceeds the acceptable tolerance.

Figure 6B:
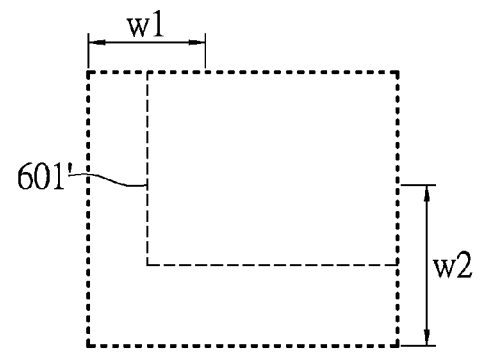

FIG. 6B then schematically depicts a centerline 601' projected from the centerline 601 in FIG. 6A. The matching process firstly verifies if any pattern matched the trajectory of centerline 601'. Next, the process verifies if the range of widths of pattern matched the defined widths (w1, w2) of centerline 601', or within an acceptable range. The weak pattern is therefore judged.

Figure 6C:
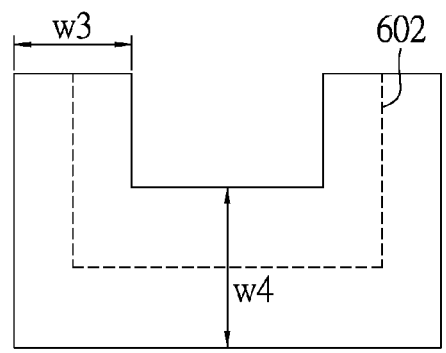
Figure 6D:
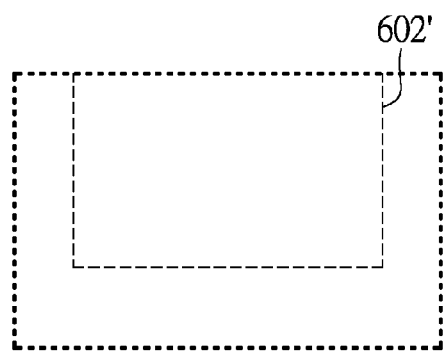

FIG. 6C shows one more basic polygon pattern matching element having a centerline 602. The centerline 602 is characterized in that different widths such as a third width w3 and a fourth width w4 are formed over different directions. The centerline and the widths form the characteristics of the polygonal pattern. Those characteristics are as the reference basis to find out the weak pattern which is matched with the basic polygon pattern matching element. FIG. 6D shows the centerline 602' projected from the centerline 602 in FIG. 6C within the basic matching element.

In addition to the centerline of the basic matching element as reference made to the matching process, the contour of pattern is also as the basis to the matching. The contour matching process is performed after the comparison using the matching element. In the contour matching process, the contour of pattern overlaps the design layout to find out the weak pattern, so as to judge if the overlapped area is within a reasonable tolerance.

It is worth noting that the contour matching/tracing method may accordingly trace the discontinuous image of the object image as appearing a single solid object. Then, multi contours of same weak pattern are overlapped together by running similar contour pattern match in computer. Also, the weak pattern polygon layout is overlapped with those contour patterns by doing contour to polygon similar pattern match. Then, we align those contours and polygon layout with center aligned.

FIG. 7A schematically shows a contour pattern matching mechanism. A weak pattern 702 to be matched is within a basic matching element 701.

FIG. 7B shows another schematic diagram depicting a basic matching element 703 which surrounds a weak pattern 704 to be matched.

When a pattern is found to be matched as comparing with the mentioned basic matching element, it is verified that the weak pattern is within a certain range. The contour of the weak pattern may be depicted. FIG. 7C schematically shows a contour-contour comparison, in which a contour 705 is drawn to depict the weak pattern 702'. The contour 705 is then assisted with the basic polygon pattern matching element 706 shown in FIG. 7D. The matching process described in FIG. 7D performs a contour-polygon comparison. Meanwhile, the weak pattern 702" is within the range of the matching element 706. In an exemplary embodiment, a threshold may be set for an overlapped area percentage of a contour or polygonal pattern, e.g. 70% to 80%. The matched weak pattern is found if the overlapped area percentage exceeds the threshold; otherwise, no weak pattern can be found.

Figure 8:
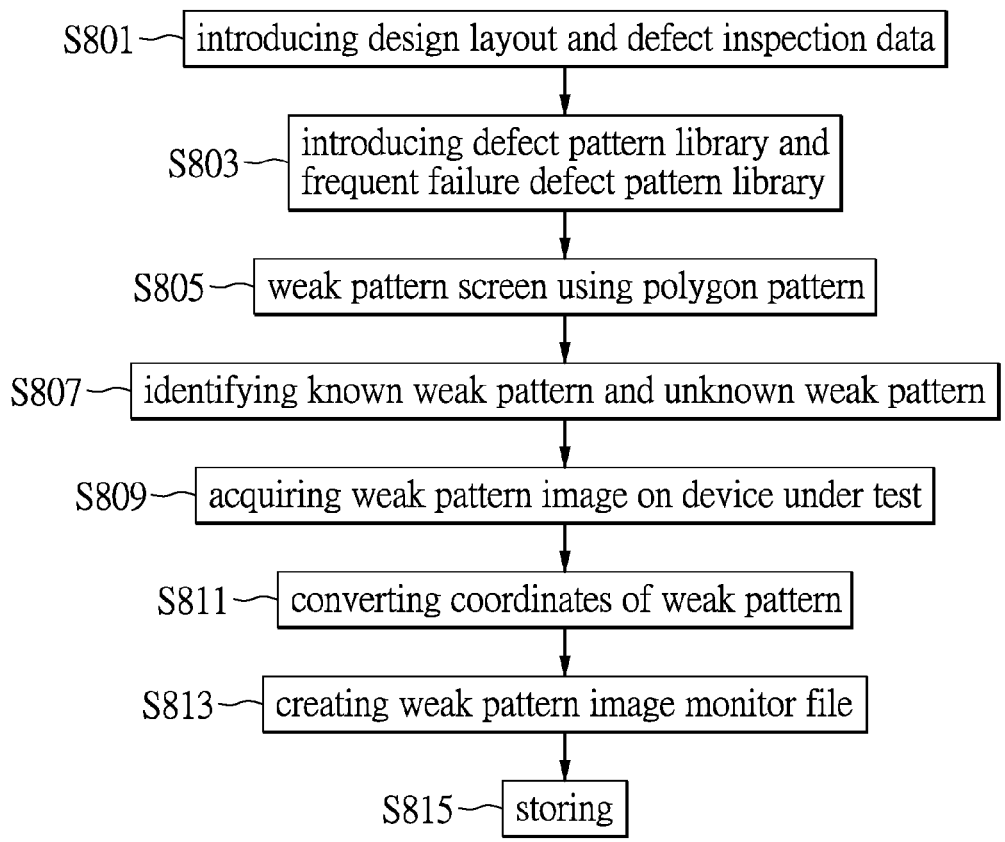
FIG. 8 shows a flow chart illustrating the steps of weak pattern screen and monitor in the method of the present invention.
Figure 9:
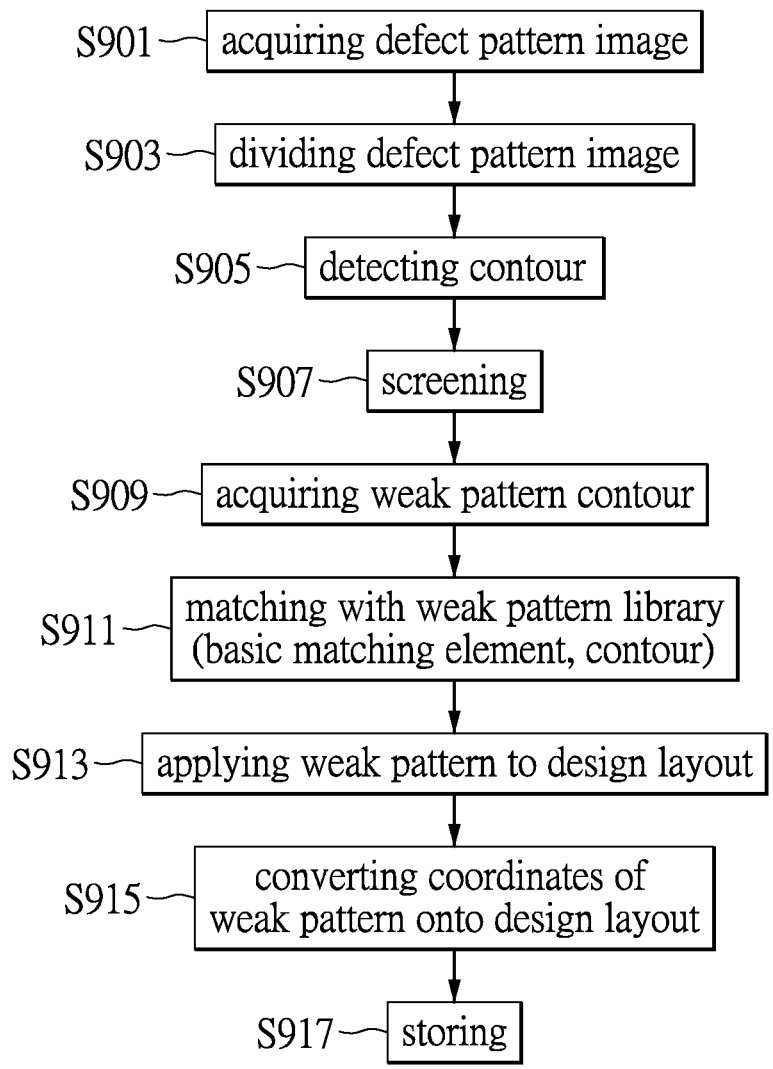
FIG. 9 shows a flow chart depicting the weak pattern metrology in the method of intelligent weak pattern diagnosis in accordance with the present invention.
Figure 10:
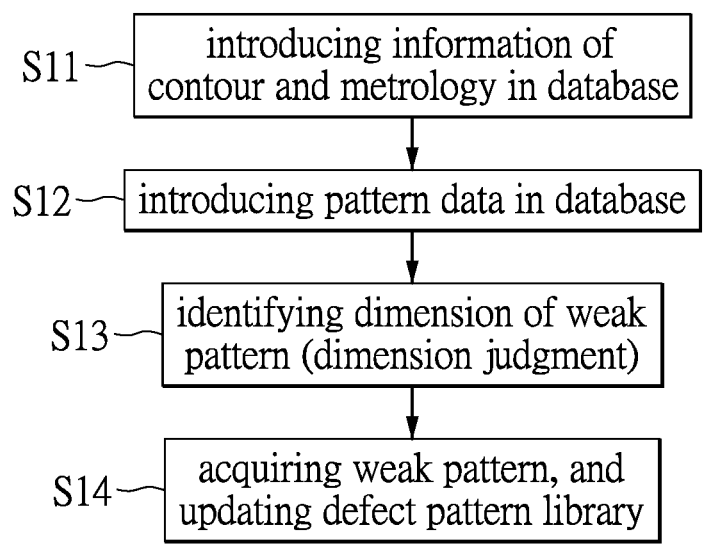
FIG. 10 depicts steps of weak pattern verification of the method in accordance with the present invention.

The various embodiment of the method for intelligent weak pattern diagnosis may be referred to FIG. 8, FIG. 9, or FIG. 10.

FIG. 8 shows a flow chart illustrating the process of weak pattern screen and monitor.

In the beginning, such as step S801, a computer-implemented system introduces a design layout and defect inspection data. A polygon pattern matching is performed. In step S803, the system introduces a defect pattern library and a frequent failure defect pattern library, e.g. the defect pattern library 211 and the frequent failure defect pattern library 212 of FIG. 2.

A polygon pattern matching is performed, such as step S805. A known or unknown weak pattern is screened out by comparing with the weak patterns in the defect pattern library and frequent failure defect pattern library. The comparison may be referred to the schemes described in FIGS. 7A, 7B, and 7C. The basic matching element is incorporated to acquiring range and location of weak pattern. The polygon matching pattern is used to judge the types of weak patterns. In step S807, the system performs an image processing using software means, so as to recognize the known and unknown weak patterns from the defect inspection data.

After that, the weak patterns on the object under test can be acquired, such as step S809. The coordinates of the weak patterns are converted from the design layout to the coordinate system of the inspection tool scanning real semiconductor product, such as step S811. The weak pattern image monitor file is therefore created (step S813), and stored into storage (step S815).

For example, while the coordinate conversion is performed in the computer system, the reference coordinates $(x_{O1}, y_{O1})$ of the weak pattern in the design layout coordinate system are converted to the defect coordinate system in the inspection tool for the real semiconductor product. That means the first reference coordinates $(x_{O1}, y_{O1})$ in the original system are described as the second reference coordinates $(x_{O2}, y_{O2})$ of the weak pattern in the defect coordinate system. The reference coordinates of the weak pattern is such as a geometric center thereof. The original coordinates $(x_1, y_1)$ of weak pattern of the design layout are converted to the marker coordinates $(x_2, y_2)$ of the inspection tool for real product.

Next reference is made to FIG. 9 illustrating the process of performing metrology of weak pattern in the method for intelligent weak pattern diagnosis in one embodiment of the present invention.

The beginning step such as S901 shows the system obtaining the image of defect pattern. In one embodiment, the image is made by scanning the object under test using an electron microscope or optical microscope. It is noted that while the image is captured by the scanning method, the reference coordinates with markers used for the design layout with the library data may be applied to the image. The reference coordinates for the weak patterns over design layout allows reducing time to scan and inspect the object under test.

Next, such as step S903, the defect pattern is divided. The image processing for the defect image is with an image segmentation scheme. The system acquires the defect image in segmentation. A contour segmentation is performed on the defect pattern. A dynamic histogram threshold is applied to discern distributions in order to distinguish the foreground pattern from the background image according to a histogram.

In step S905, an edge detection is performed in the system for tracing the contour of pattern. The edge detection process incorporates a high frequency filter, a low frequency filter, bandpass filter into tracing contour and screen out the weak patterns (step S907). The contour of weak pattern is therefore acquired (step S909). The contour is then compared with the pattern data in the weak pattern library, including the matching process employing the basic matching elements such as square and polygon, and contour tracing (step S911). The matching process using the basic matching elements, and further in view of distances and directions among the basic matching elements for every weak pattern. The same or similar patterns may therefore be found within an acceptable tolerance. As in contour matching process, the contours of basic polygon pattern matching elements are overlapped over the design layout, the overlapped area percentage is reference to judge if any matched pattern is found. The matching process is such as the illustration in FIG. 6 and FIG. 7. The same and similar patterns can be found within an acceptable tolerance.

On the contrary, such as step S913, the weak patterns obtained are applied to the design layout. For example, the design layout with weak patterns is overlapped with those contour patterns by performing contour to polygon similar pattern match. The overlapping process also requires alignment of the centerlines of the various patterns. The coordinates system for the weak patterns is then converted to the system for design layout (step S915). In an exemplary example, a graphic user interface of the system is provided for the user to adjust the dimension scale, e.g. a bar ruler is introduced. The metrology tool is also employed to convert the pixels of contour onto the dimension of design layout, and further stored into or updating the original library (step S917).

The scheme to recognize the weak patterns in the method for intelligent weak pattern diagnosis may be referred to the flow chart in FIG. 10. When the weak patterns onto the design layout are acquired, the computer-implemented intelligent weak pattern diagnosis system is required to recognize the types of weak patterns.

In the method, such as step S11, the contour and metrology data for every weak pattern in the library are introduced. An image of real object under test, and its contour and metrology data may also be obtained by the scanning electron microscope or optical microscope. In the meantime, in step S12, the system introduces the images on the design layout in library. The software or hardware-based method is used to recognize the real weak patterns and the patterns of design layout. The contour of weak pattern recorded in the library and the patterns on the design layout are the major references to identify the true weak patterns but not the non-weak patterns. The system may obtain the dimensions of those recognizable weak patterns (step S13). These new weak patterns may be used to update the defect pattern library, such as step S14.

In one of the embodiments in the disclosure, provided is further a non-transitory computer-readable storage medium. In the storage medium, a program having an instruction set for performing the method for intelligent weak pattern diagnosis is provided. As an intelligent weak pattern solver software, the instruction set is executed in a computer system. The instruction set includes instruction for introducing weak pattern layout from a defect pattern library and a frequent failure defect pattern library; instruction for acquiring defect inspection data through a defect inspection tool in Fab; instruction for introducing design layout, in which the design layout at least includes various systematic defect and weak patterns; instruction for executing weak pattern screen and filter, used to acquire a known pattern group by comparing the weak patterns from the libraries and the design layout; instruction for performing unknown weak pattern screen and filter, including performing pattern similarity matching on the design layout data for finding out the weak patterns, which do not belong to and are not similar with the patterns recorded in the defect pattern library or the frequent failure defect pattern library, so as to acquire a unknown weak pattern group; instruction for acquiring distribution of the known weak pattern group and the unknown weak pattern group; instruction for acquiring an image of object under test, including coordinates and metrology data of the weak patterns of the object under test; instruction for performing image processing, for acquiring contour, dimension, range and number of the weak patterns, so as to judge systematic weak patterns; and instruction for updating the weak pattern library.

Thus, according to the embodiment of the method for intelligent weak pattern diagnosis, the weak pattern in layout design from the defect pattern library and the frequent failure defect pattern library. The mentioned fab defect inspection tool is utilized to judge the layout, acquire defect data by the fab defect inspection tool. In view of the design layout, the scheme of weak pattern screen can acquire known and unknown weak patterns which may be used to update the defect pattern library. The systematic weak patterns over the real semiconductor product can be found by the contour matching.

In the system and method for the intelligent weak pattern diagnosis system, the weak patterns with the metrology data can be obtained by matching process, and the weak patterns may be used to update the defect pattern library for future consideration to the fabrication process.

The above-mentioned descriptions represent merely the preferred embodiment of the present invention, without any intention to limit the scope of the present invention thereto. Various equivalent changes, alternations or modifications based on the claims of present invention are all consequently viewed as being embraced by the scope of the present invention.

What is claimed is:

1. A method of an intelligent weak pattern by a computer-implemented intelligent weak pattern diagnosis system with a defect scan and inspection tool in a fab to defect an inspection data, comprising:
   creating at least one basic matching element over an object under test;
   introducing, by a processor, a weak pattern layout from a defect pattern library and a frequent failure defect pattern library;
   acquiring, by the processor, the defect inspection data by using a defect inspection tool in the fab;
   introducing, by the processor, a design layout data which at least includes various systematic defect and weak patterns;
   executing, by the processor, weak pattern screen and filter to acquire a known weak pattern group by comparing the weak patterns from the libraries and the design layout, the design layout data compared with weak patterns in the defect pattern library and the frequent failure defect pattern library, and being categorized into a known weak pattern group;
   performing, by the processor, unknown weak pattern screen and filter, wherein the weak patterns found from pattern similarity matching, which do not belong to and are not the same as the weak patterns in the defect pattern library and the frequent failure defect pattern library, are found as compared with the design layout from the computer system, and being categorized into an unknown weak pattern group;
   obtaining, by the processor, distribution of the known weak pattern group and the unknown weak pattern group;
   acquiring, by the processor, an image of the object under test within the unknown weak pattern group having the similar but not identical weak patterns, so as to obtain the coordinates and metrology data of the weak patterns on the object under test;
   converting the defect or weak patterns found on the coordinate system of design layout with an origin ($x_0$, $y_0$) to the coordinate system with the origin ($x_1$, $y_1$) of the defect inspection tool that scans the real semiconductor product;
   performing, by the processor, image processing to obtain contour of the weak patterns, dimension, range and number of the weak patterns by using the coordinate system to update the weak pattern library; and
   detecting, by the processor, a defect on the real semiconductor product using by contour matching using the weak pattern layout in the updated weak pattern library.

2. The method according to claim 1, wherein the step of weak pattern screen and filter includes a step of contour matching, wherein:
   introducing one or more basic matching elements and one or more basic polygon pattern matching elements; and
   comparing with patterns on the object under test.

3. The method according to claim 2, wherein, in the step of contour matching, an overlapped area percentage of the every pattern of the object under test and the one basic matching element or basic polygon pattern matching element is as basis of judgment, and further in view of centerline of the basic matching element or the basic polygon pattern matching element, so as to judge a similar weak pattern within an acceptable tolerance.

4. The method according to claim 3, wherein, in the step of contour matching using the centerline of the basic matching element or the basic polygon pattern matching element, dimension of every matching element, direction, distance, and connection between the matching elements are introduced.

5. The method according to claim 4, wherein the basic polygon pattern matching element is a geometric patterns having one or more turning points; the contour matching is performed when the basic polygon pattern matching element is in clockwise or counterclockwise rotation with instant adjustment of size of the basic polygon pattern matching element, so as to find out the same or similar weak pattern.

6. The method according to claim 5, wherein the weak pattern is verified by compared with the basic matching element or the basic polygon pattern matching element, and the defect pattern library is updated.

7. The method according to claim 1, wherein the image of object under test is obtained by inspection by a scanning electron microscope, e-Beam, or an optical microscope.

8. The method according to claim 7, wherein the scanning electron microscope is used to monitor and preview the object under test, and an e-Beam scan tool is used to detect and verify the weak patterns on the object under test.

9. The method according to claim 8, wherein the method is applicable to a wafer manufacturing process in the fab.

10. The method according to claim 8, wherein the method is applicable to a process in assembly house or the mask house.

11. The method according to claim 8, wherein the method is applicable to a manufacturing process for printed circuit board, carrier board, flexible board, flat display panel, wafer bump, light-emitting diode, or solar cell.

12. An intelligent weak pattern diagnosis system for diagnosing the intelligent weak pattern being implemented by a computer, comprising:
   creating at least one basic matching element over an object under test;
   introducing, by a processor, a weak pattern layout from a defect pattern library and a frequent failure defect pattern library;
   acquiring, by the processor, the defect inspection data by a defect inspection tool in a process plant;
   introducing, by the processor, design layout data which includes systematic defect and weak patterns;
   executing, by the processor, weak pattern screen and filter to acquire a known weak pattern group by comparing the weak patterns from the libraries and the design layout, in which the design layout data is compared with weak patterns recorded in the defect pattern library and the frequent failure defect pattern library, so as to acquire a known weak pattern group;
   performing, by the processor, unknown weak pattern screen and filter, in which pattern similarity matching is performed on the design layout data acquired by the computer, so as to find out weak patterns, which do not belong to and are not similar with the patterns in the defect pattern library or the frequent failure defect pattern library, categorized into a unknown weak pattern group;
   acquiring, by the processor, distribution of the known weak pattern group and the unknown weak pattern group;
   acquiring, by the processor, an image of object under test, including coordinates and metrology data of the weak patterns of the object under test;
   converting the defect or weak patterns found on the coordinate system of design layout with an origin ($x_0$, $y_0$) to the coordinate system with the origin ($x_1$, $y_1$) of the defect inspection tool that scans the real semiconductor product;

performing, by the processor, image processing, for acquiring contour of the weak patterns, dimension, range and number of the weak patterns to update the weak pattern library; and detecting, by the processor, a defect on the real semiconductor product using by contour matching using the weak pattern layout in the updated weak pattern library.

13. The system according to claim 12, wherein the weak pattern screen and filter includes a contour matching, wherein:

introducing one or more basic matching elements and one or more basic polygon pattern matching elements; and comparing with patterns on the object under test.

14. The system according to claim 13, wherein contour matching introduces an overlapped area percentage of the every pattern of the object under test for judgment of the weak patterns.

15. The system according to claim 14, wherein one basic matching element or basic polygon pattern matching element, and further in view of centerline of the basic matching element or the basic polygon pattern matching element are as basis of judgment of the weak patterns within an acceptable tolerance.

16. The system according to claim 15, wherein contour matching using the centerline of the basic matching element or the basic polygon pattern matching element introduces dimension of every matching element, direction, distance, and connection between the matching elements.

17. The system according to claim 16, wherein the basic polygon pattern matching element is a geometric patterns having one or more turning points; and the contour matching is performed when the basic polygon pattern matching element is in clockwise or counterclockwise rotation with instant adjustment of size of the basic polygon pattern matching element.

18. The system according to claim 12, wherein the weak pattern is verified by compared with the basic matching element or the basic polygon pattern matching element, and the defect pattern library is updated.

19. An instruction set for diagnosing an intelligent weak pattern stored in a non-transitory computer-readable storage medium, wherein the instruction set comprises:

creating at least one basic matching element over an object under test;

introducing, by a processor, weak pattern layout from a defect pattern library and a frequent failure defect pattern library;

acquiring, by the processor, defect inspection data by a defect inspection tool in a process plant;

introducing, by the processor, the design layout data, including various systematic defect and weak patterns;

executing, by the processor, weak pattern screen and filter to acquire a known weak pattern group by comparing the weak patterns from the libraries and the design layout, for comparing the design layout data with the weak patterns recorded in the defect pattern library and the frequent failure defect pattern library, so as to acquire a unknown weak pattern group;

performing, by the processor, unknown weak pattern screen and filter, including performing pattern similarity matching on the design layout data for finding out the weak patterns, which do not belong to and are not similar with the patterns recorded in the defect pattern library or the frequent failure defect pattern library, so as to acquire a unknown weak pattern group;

acquiring, by the processor, distribution of the known weak pattern group and the unknown weak pattern group;

acquiring, by the processor, an image of object under test, including coordinates and metrology data of the weak patterns of the object under test;

converting the defect or weak patterns found on the coordinate system of design layout with an origin ($x_0$, $y_0$) to the coordinate system with the origin ($x_1$, $y_1$) of the defect inspection tool that scans the real semiconductor product;

performing, by the processor, image processing, for acquiring contour of the weak patterns, dimension, range and number of the weak patterns, so as to judge systematic weak patterns;

updating, by the processor, the weak pattern library; and detecting, by the processor, a defect on the real semiconductor product using by contour matching using the weak pattern layout in the updated weak pattern library.

* * * * *